United States Patent [19]
Howard

[11] 4,437,139
[45] Mar. 13, 1984

[54] LASER ANNEALED DIELECTRIC FOR DUAL DIELECTRIC CAPACITOR

[75] Inventor: James K. Howard, Morgan Hill, Calif.

[73] Assignee: International Business Machines Corporation, Armonk, N.Y.

[21] Appl. No.: 450,629

[22] Filed: Dec. 17, 1982

[51] Int. Cl.$^3$ .................. H01G 3/075; H01G 7/00; H01L 21/26
[52] U.S. Cl. .................. 361/313; 29/25.42; 148/1.5
[58] Field of Search ............... 148/1.5; 361/312, 313, 361/323; 29/25.42

[56] References Cited

U.S. PATENT DOCUMENTS

| | | | |
|---|---|---|---|
| 3,085,052 | 4/1963 | Sibert | 204/38 |
| 3,201,667 | 8/1965 | Varga | 361/313 |
| 3,257,305 | 6/1966 | Varga | 204/192 |
| 3,305,394 | 2/1967 | Kaiser et al. | 117/217 |
| 3,420,719 | 1/1969 | Potts | 148/188 |
| 3,568,014 | 3/1971 | Schuermeyer | 361/313 |
| 3,819,990 | 6/1974 | Hayashi et al. | 361/313 |
| 3,969,197 | 7/1976 | Tolar et al. | 204/15 |
| 4,151,008 | 4/1979 | Kirkpatrick | 148/1.5 |
| 4,181,538 | 1/1980 | Narayan et al. | 148/1.5 |
| 4,267,014 | 5/1981 | Davey et al. | 148/1.5 X |

OTHER PUBLICATIONS

J. Appl. Phys. 52(8), 8/81, "Laser Annealing to Produce Ferroelectric-Phase PbTiO$_3$ Thin Films," Y. Matsui, pp. 5107-5111.

Semiconductors & Semimetals, vol. II, Solar Cells, "Antireflective Coatings," 1975 Academic Press, H. J. Hovel, pp. 203-207.

Thin Solid Films, "Thin Film Phenomena," K. Chopra, McGraw Hill, 1969, pp. 770-775.

IBM Technical Disclosure Bulletin, vol. 22, No. 12, May 1980, "Selective Laser Annealing Through Quarter- and Half-Wave Coatings," A. B. Fowler and R. T. Hodgson, pp. 5473-5474.

Primary Examiner—Donald A. Griffin
Attorney, Agent, or Firm—Mitchell S. Bigel

[57] ABSTRACT

A thin film capacitor having a high dielectric constant and low leakage current includes a dual dielectric structure. The dual dielectric comprises a leakage current blocking first dielectric layer and a high dielectric constant second dielectric layer. The high dielectric constant second dielectric layer is formed by laser annealing a ferroelectric forming titanate or zirconate into a ferroelectric. A leakage current blocking first dielectric layer may also serve as an antireflective coating for the titanate or zirconate layer so that better coupling of the laser energy to the titanate or zirconate layer is obtained.

22 Claims, 3 Drawing Figures

LASER ANNEALED DIELECTRIC FOR DUAL DIELECTRIC CAPACITOR

DESCRIPTION

1. Technical Field

This invention relates to capacitor structures, and more particularly, to capacitor devices with dual dielectrics wherein one of the dielectric layers is formed by laser annealing.

In the semiconductor fabrication art, there is increasing interest in the use of capacitors to improve the performance and response of integrated circuits. Integrated circuit configurations have evolved which require the fabrication of capacitor structures with high dielectric constants and low leakage currents. Likewise, multilayer ceramic substrates for integrated circuit packaging require the fabrication of decoupling capacitors having high dielectric constants and low leakage currents.

2. Background Art

Titanates and zirconates are complex inorganic compounds which in crystalline form exhibit a high dielectric constant and ferroelectric properties. As a result of their high dielectric constants, the ferroelectric forming titanates and zirconates have been employed as capacitor dielectrics. Some common titanates used in capacitor applications include $CaTiO_3$, $SrTiO_3$, $BaTiO_3$ and $PbTiO_3$. Some common zirconates used in capacitor applications include lead zirconate titanate (PZT) and lead zirconate lanthanum modified titanate (PZLT).

In order to obtain the highest capacitance per unit area, it is necessary to prepare a thin crystalline film of the titanate or zirconate. However, when ferroelectric forming titanates or zirconates are deposited in thin film form, they are generally amorphous, and exhibit low dielectric constants. In order to form crystalline thin films of titanates or zirconates, the thin film must be deposited at high temperatures, e.g., by sputtering, or deposited at low temperatures and subsequently annealed at high temperatures.

Unfortunately, high temperature deposition or high temperature post deposition annealing produce other undesirable effects. For example, these high temperature processes produced Pb vacancies, oxygen diffusion or other stoichiometric changes in the thin film structure which effect the dielectric constant thereof. These changes vary from run to run so that large and unpredictable variations in dielectric constant result. Moreover, high temperature processing has deleterious effects on the other active devices (e.g., transistors) on an integrated circuit chip so that overall chip performance is degraded.

An attempt to fabricate ferroelectric thin films of $PbTiO_3$ without high temperature deposition or high temperature post deposition annealing is described in the Journal of Applied Physics, Vol. 52, No. 8, August 1981, pp. 5107–5111, entitled "Laser Annealing to Produce Ferroelectric-Phase $PbTiO_3$ Thin Films." Disclosed is a method of producing ferroelectric thin films of $PbTiO_3$ by rf sputtering at low temperature and annealing by laser beam irradiation using a $CO_2$ laser.

The use of thin film titanates or zirconates as the dielectric for integrated circuit capacitors also creates a leakage current problem. More particularly, it is well known that ferroelectric zirconates or titanates have high DC leakage currents due to the crystalline structure thereof. This high DC leakage current produces an unsatisfactory value of dielectric loss for most capacitor applications.

A thin film capacitor structure having high capacitance in conjunction with low DC leakage is described in copending commonly assigned application Ser. No. 182,740 entitled "Capacitor Structures with Dual Dielectrics," filed Aug. 29, 1980 on behalf of J. K. Howard, the disclosure of which is incorporated herein by reference. Described is a capacitor structure including a first dielectric layer formed of silicon nitride, aluminum oxide or silicon dioxide and a second dielectric layer formed of selected metal oxides and titanates of the group $Ta_2O_5$, $HfO_2$, $PbTiO_3$, $BaTiO_3$, $CaTiO_3$, $TiO_2$ and $SrTiO_3$.

DISCLOSURE OF THE INVENTION

It is an object of the invention to provide an improved capacitor structure for integrated circuit and other state of the art applications.

It is another object of the invention to form capacitors having high dielectric constant and low leakage currents.

It is another object of the invention to provide a process of forming capacitors without producing other undesirable effects.

It is yet another object of the invention to provide a process of forming capacitors having controllable and repeatable properties.

These and other objects are accomplished by forming a capacitor on an integrated circuit, ceramic or other substrate, the capacitor comprising a dual dielectric between the two capacitor electrodes. The dual dielectric comprises a first dielectric layer adjacent one of the electrodes, for preventing the flow of leakage currents across the electrodes. The second dielectric layer is a high dielectric constant layer which is formed by laser annealing an amorphous thin film layer of a ferroelectric forming titanate or zirconate to a ferroelectric.

The capacitor structure of the present invention exhibits a low leakage value as a result of the leakage current blocking first dielectric layer, and a high dielectric constant as a result of the ferroelectric titanate or zirconate second dielectric layer. Moreover, since the second dielectric layer is formed by laser annealing a thin film of a ferroelectric forming titanate or zirconate to a ferroelectric, none of the undesirable effects of high temperature deposition or high temperature post annealing are present. More particularly, since laser pulse intensity and duration are easily controlled, uniform capacitor properties may be obtained from chip to chip. Laser annealing also produces instantaneous heating so that Pb vacancies, oxygen diffusion or other stoichiometric changes do not take place.

A capacitor according to the present invention may be fabricated by a process of depositing a bottom electrode on a substrate, depositing an amorphous thin film layer of a ferroelectric forming titanate or zirconate on the bottom electrode and depositing a leakage current blocking dielectric layer on the amorphous thin film layer. The ferroelectric forming titanate or zirconate is then laser annealed to the ferroelectric phase and a top electrode is deposited on the dielectric layer. When practicing the above process, the leakage current blocking dielectric layer may also serve as an antireflective coating for the titanate or zirconate layer so that better coupling of the laser energy to the titanate or zirconate layer is obtained.

BEST MODE FOR CARRYING OUT THE INVENTION

Figure 1:
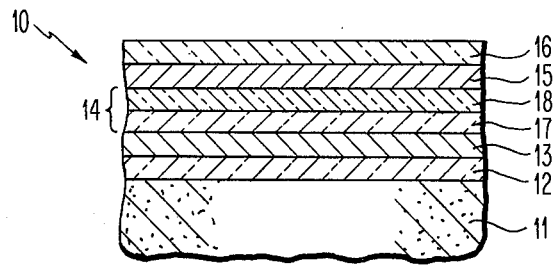
FIGS. 1-3 illustrate cross-sectional views of capacitors formed according to the present invention.

Referring now to FIG. 1, there is shown a capacitor 10, (not drawn to scale) formed according to the present invention. Capacitor 10 is fabricated on silicon semiconductor or ceramic substrate 11, as a part of an integrated circuit chip or multilayer ceramic structure. Substrate 11 optionally may include a thin (approximately 500-5000 Å) layer 12 of $SiO_2$ for isolating the capacitor therefrom.

Capacitor 10 comprises bottom electrode 13, dielectric 14 and top electrode 15. Bottom electrode 13 is preferably a dual bottom electrode structure as will be described more particularly below. Dielectric 14 comprises a dual dielectric structure as described more particularly below. Top electrode 15 is here shown as a single layer although a multilayer structure may also be employed. Finally, a passivating layer 16 of $SiO_2$ may be formed on top electrode 15.

A method of forming integrated circuit capacitors according to the present invention will now be described. As specified above, capacitor 10 may be formed directly on substrate 11 or upon an $SiO_2$ passivating layer 12 grown thereon. Bottom electrode 13 is then formed. While bottom electrode 13 may be a single layer, e.g., PtSi, TiN or $Ti_{10}W_{90}$ alloy directly on substrate 11, or TiN, TiW, Ti or Ta on $SiO_2$ passivating layer 12, it is preferably a dual bottom electrode structure described in commonly assigned copending application Ser. No. 335,136 filed on Dec. 28, 1981 on behalf of J. K. Howard et al., entitled "A Thin Film Capacitor With a Dual Bottom Electrode Structure," the disclosure of which is incorporated herein by reference. More particularly, bottom electrode 13 is formed by electron beam evaporating or sputtering a first layer of Zr, Hf or Ta (thickness 500-700 Å) on $SiO_2$ passivating layer 12 and then sputtering a Pt layer (thickness 10,000 Å) thereon. The dual bottom electrode structure is then heat treated to form an intermetallic phase of $ZrPt_3$, $HfPt_3$, or $TaPt_3$ as described in the above referenced copending application.

Dielectric 14 is then formed on bottom electrode 13. Referring to FIG. 1, dielectric layer 14 comprises a high dielectric constant layer 17 and a leakage current preventing dielectric layer 18.

High dielectric constant layer 17 comprises a thin film (approximately 200-8000 Å) of a ferroelectric forming titanate or zirconate, e.g., $PbTiO_3$, $BaTiO_3$, $CaTiO_3$, $SrTiO_3$, PZT or PZLT. Amorphous thin films of $BaTiO_3$ may be formed by sputtering in an Rf diode (2 kw) system using a target approximately 8″ in diameter having a pressed target material of approximately 80% of the theoretical density. When sputtered in argon (AR) plasma at 750 or 1000 watts and 10 millitorr total pressure, a deposition rate of 93-110 Å per minute is obtained. A refractive index of 1.91-1.93 and dielectric constant of approximately 18 is obtained. $BaTiO_3$ films of comparable thickness may be prepared in an Ar-10% $O_2$ plasma. PZT or PZLT films may be prepared from an 8″ target (80% theoretical density) using similar deposition conditions. For the same power levels, deposition rates of approximately 200 Å per minute are obtained. A refractive index of 1.9-2.2 and a dielectric constant of approximately 45 is obtained. Amorphous thin films of other ferroelectric forming zirconates and titanates may be prepared in a like manner.

The amorphous thin film ferroelectric forming titanate or zironcate layer 17 is then laser annealed to the high dielectric constant ferroelectric phase. A cw-Ar, Q switched ruby, Nd-yag, $CO_2$ or other laser may be employed. For example, a 4200 Å dye laser in pulses of 10 nanoseconds having a peak power of approximately 65 watts may be employed to anneal a thin $BaTiO_3$ film. Under these conditions, laser annealing increases the $BaTiO_3$ dielectric constant from approximately 18 to over 500 for a thirty fold increase. Laser annealing other titanates or zirconates will increase the dielectric constant ten to fifty times. Moreover, if low fluence radiation is employed, stoichiometric changes to layer 17 will be avoided. The laser may be used to anneal the entire layer 17. Alternatively, a thin laser beam may scan layer 17 to form alternate portions of laser annealed and unannealed titanate or zirconate.

After layer 17 is laser annealed, leakage current preventing dielectric layer 18 is deposited thereon. Layer 18 may comprise $Si_3N_4$, $Al_2O_3$, or $SiO_2$ (approximately 200-2000 Å) and may be deposited by processes well known to those having skill in the art. It will be noted, however, that such deposition processes must be low temperature (less than about 350° C.) deposition processes, e.g., low temperature chemical vapor deposition (CVD), plasma enhanced deposition, or rf sputtering on water cooled substrates so that the deleterious effects of high temperature processing on laser annealed dielectric layer 18 do not occur.

After dual dielectric 14 is formed, a top electrode 15, which may be Al, alloys thereof, or multiple metal layers, is deposited thereon. An $SiO_2$ passivating layer 16 may be formed on top electrode 16. Finally, contacts to top electrode 16 may be made using standard photolithographic processes.

Figure 2:
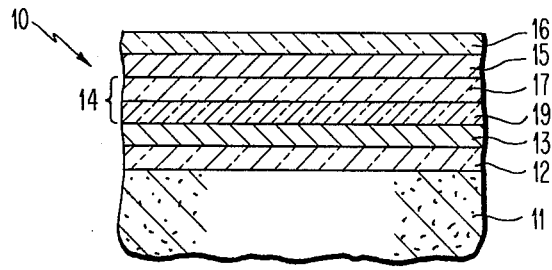

Referring now to FIG. 2, a capacitor 10 having reverse order dual dielectric 14 is shown. In contrast with FIG. 1, leakage blocking dielectric layer 19 is first deposited, followed by laser annealed high dielectric constant layer 17. The composition and process of forming high dielectric constant layer 17 is the same as FIG. 2. The composition of leakage blocking dielectric layer 19 is the same as that of leakage blocking layer 18 of FIG. 2. However, since leakage blocking layer 19 (FIG. 2) is formed prior to laser annealed layer 17, leakage blocking layer 19 may be formed by high temperature (i.e., approximately 800° C.) CVD, sputtering or other high temperature deposition techniques. This contrasts with FIG. 1 wherein leakage blocking layer 18 had to be formed by low temperature (i.e., less than about 350° C.) techniques, to prevent undesirable stoichiometric effects in laser annealed layer 17.

A preferred method of forming a dual dielectric according to the present invention will now be described. Referring again to FIG. 1, an amorphous thin film layer 17 of ferroelectric forming zirconate or titanate is formed. Leakage current preventing dielectric layer 18 is then deposited on layer 17. Layer 17 is then laser annealed by passing a laser beam through layer 18 into layer 17. When practicing this method, leakage current preventing dielectric layer 18 also functions as an antireflective coating (ARC) to minimize reflection and increase laser absorption in layer 17.

Antireflective coatings (ARC) are well known in the art. For example, Volume 11 of "Semiconductors and Semimetals" by Harold J. Hovel, pgs. 203-207, discloses the use of ARC's in the design of solar cells and derives the equations for calculating optimum ARC composition and thickness for a given application. According to the present invention, leakage current preventing dielectric layer 18 also functions as an ARC for ferroelectric forming zirconate or titanate layer 17. The composition and the thickness of ARC layer 18 is a function of the composition of layer 17 and the laser employed. The optimal composition and thickness of ARC layer 18 may be calculated as follows:

Assume that ferroelectric forming dielectric layer 17 is coated with a single nonabsorbing film 18 of thickness $d_1$, then the total reflection of laser wavelength $\lambda$ is:

$$R = \frac{r_1^2 + r_2^2 + 2r_1r_2 \cos 2\theta}{1 + r_1^2 r_2^2 + 2r_1r_2 \cos 2\theta} \quad (1)$$

where $$r_1 = \frac{n_0 - n_1}{n_0 + n_1}, r_2 = \frac{n_1 - n_2}{n_1 + n_2} \quad (2)$$

and
$n_0$ = index of refraction of air = 1
$n_1$ = refractive index of ARC layer 18
$n_2$ = refractive index of ferroelectric forming dielectric layer 17, and
$\theta = 2\pi \, n_1 d_1/\lambda$.

The reflectivity (R) has a minimum at a quarter wavelength, where $$n_1 d_1 = \lambda/4 \quad (3)$$

and $$R(\lambda/4) = \left[ \frac{n_1^2 - n_0 n_2}{n_1^2 + n_0 n_2} \right]^2 \quad (4)$$

The reflectivity is equal to zero if $n_1^2 = n_0 n_2$. Thus, since $n_0 = 1$ (air), R=0 if $$n_1 = \sqrt{n_2}. \quad (5)$$

Thus, the thickness $d_1$ and refractive index $n_1$ of ARC 18 can be calculated using equations (3) and (5), given the laser wavelength $\lambda$ and the refractive index $n_2$ of layer 17. This calculation neglects the effect of bottom electrode 13, and will only be exact when none of the laser energy reaches bottom electrode 13.

The effect of the bottom electrode may be taken into account by employing equations for a multilayer ARC. A description of a multilayer ARC and equations for calculating the parameters thereof may be found in K. L. Chopra, "Thin Film Phenomena" (1969) at page 773. For a multilayer ARC, equation (4) becomes $$R(\lambda/4) = \left[ \frac{n_1^2 n_3 - n_2^2 n_0}{n_1^2 n_3 + n_2^2 n_0} \right]^2 \quad (6)$$

under the conditions $$n_1 d_1 = n_2 d_2 = \lambda/4, \tfrac{3}{4}\lambda \ldots \quad (7)$$

where $n_1$, $d_1$, $n_2$ and $d_2$ are the refractive indices and thicknesses of ARC layer 18 and titanate/zirconate layer 17, respectively, and $n_3$, $d_3$ is the refractive index and thickness of bottom electrode 13. The condition for R=0 is $$\frac{n_2}{n_1} = \sqrt{n_3} \quad (8)$$

Thus, equations (7) and (8) can be used for selecting a single layer antireflection coating 18 when the ferroelectric forming dielectric layer 17 is deoposited onto an absorbing bottom electrode 13.

As a first approximation, equation (5) may be used to calculate the optimum ARC and the thickness thereof for various ferroelectric forming titanates and zirconates which are to be laser annealed. For example, when BaTiO$_3$ (n=2.0) is employed, the preferred refractive index ($n_1$) for ARC layer 18 is 1.414, while for PZLT or PZT (n=1.8) the preferred refractive index ($n_1$) for ARC layer 18 is 1.34. Table 1 contains a list of potential ARC materials and their refractive index values (n). The dielectric constant ($\epsilon$) values are also included in Table 1. Note, that these dielectric materials are known to be appropriate low leakage dielectrics for capacitor applications as shown in P. J. Harrop and D. S. Cambell, "Thin Solid Films," Vol. 2, p. 273 (1968).

TABLE 1

| Material | n | $\epsilon$ |
| --- | --- | --- |
| Al$_2$O$_3$ | 1.5–1.65 | 9 |
| SiO$_2$ | 1.44 | 4 |
| TiO$_2$ | 2.4 | 4–40 |
| Ta$_2$O$_5$ | 2.2–2.4 | 24 |
| Y$_2$O$_3$ | 1.9 | 16–18 |
| ZrO$_2$ | 2.1 | 16–18 |
| HrO$_2$ | 1.98 | ~18 |
| Si$_3$N$_4$ | 1.9–2.0 | 7 |

Inspection of table 1 indicates that SiO$_2$ (n=1.44) should be the best ARC for BaTiO$_3$, PZT and PZLT. However, other materials listed in table 1 may also be appropriate, because their less than optimal index of refraction may be somewhat compensated by their larger dielectric constants or other desirable properties. In particular, it has been found that Si$_3$N$_4$ (sputtered, low temperature CVD or plasma enhanced) is an excellent ARC despite its less than optimal index of refraction, because it has lower leakage, a higher dielectric constant and a higher breakdown voltage than SiO$_2$. Moreover, Si$_3$N$_4$ acts as a diffusion barrier to retain the stoichiometry of layer 17. Si$_3$N$_4$ does not adhere well to PZT or PZLT, so that a preferred ARC for these materials is a dual ARC layer comprising a thin SiO$_2$ layer on the PZT or PZLT, and an Si$_3$N$_4$ layer on the SiO$_2$. Si$_3$N$_4$ does adhere to BaTiO$_3$ so that an intervening SiO$_2$ layer may not be necessary.

The thickness, $d_1$, of ARC layer 16 can be computed using Equation (3) for various laser wavelengths $\lambda$. Table 2 lists several laser materials, their wavelength, and the SiO$_2$ and Si$_3$N$_4$ thickness ($d_1$) for R=0 when used as an antireflection coating for BaTiO$_3$.

TABLE 2

| Laser | $\lambda$(A°) | SiO$_2$ Thickness, (Å) | Si$_3$N$_4$ Thickness (Å) |
| --- | --- | --- | --- |
| dye | 4200 | 729 | 530 |
| Ar(CW) | 5100 | 885 | 644 |
| Ruby | 6900 | 1198 | 871 |

TABLE 2-continued

| Laser | λ(Å) | SiO$_2$ Thickness, (Å) | Si$_3$N$_4$ Thickness (Å) |
| --- | --- | --- | --- |
| Yag | 10600 | 1840 | 1338 |
| CO$_2$ | 10.2 × 10$^4$ | 17708 | 12878 |

Figure 3:
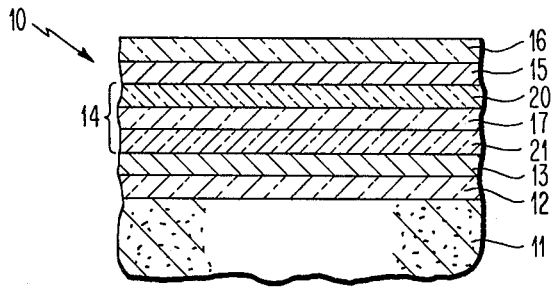

Although the above description referred to a leakage preventing dielectric layer 18 (FIG. 1) which also functions as an ARC, the separate functions can be performed by two separate layers. More particularly, referring to FIG. 3, leakage current preventing dielectric layer 21 may be deposited on bottom electrode 13. A ferroelectric forming zirconate or titanate layer 17 may then be deposited on layer 21. An ARC layer 20 is deposited on layer 17 and layer 17 is laser annealed through ARC 20. ARC 20 may be retained as part of the capacitor structure or may be removed prior to depositing top electrode 15. If ARC 20 is removed, it need not be one of the dielectrics listed in Table 1, but may be a semiconductor (e.g., amorphous or polycrystalline Si or Ge) or a low reflectivity metal.

When separate leakage current preventing dielectric layers and ARC layers (FIG. 3) are employed, ARC parameters may be calculated using Equations (7) and (8). Thus, for example, if BaTiO$_3$ layer 17 is deposited on a leakage current preventing Si$_3$N$_4$ layer 21, we obtain $n_1 = 1.414$ which is the index of refraction of SiO$_2$ (Table 2).

Whereas I have illustrated and described the preferred embodiment of the invention, it is to be understood that I do not limit myself to the precise construction herein disclosed and the right is reserved to all changes and modifications coming within the scope of the invention as defined in the appended claims.

I claim:

1. A method of forming a capacitor on a substrate, comprising the steps of:
 depositing a bottom electrode on the substrate;
 depositing an amorphous thin film layer of a ferroelectric forming titanate or zirconate on said bottom electrode;
 depositing a leakage current preventing dielectric layer on said amorphous thin film layer;
 laser annealing said amorphous thin film layer to a crystalline ferroelectric; and
 depositing a top electrode on said dielectric layer.

2. The method of claim 1 wherein said bottom electrode comprises a first layer of Zr, Hf or Ta and a second layer of Pt.

3. The method of claim 1 wherein said ferroelectric forming titanate or zirconate is PbTiO$_3$, BaTiO$_3$, CaTiO$_3$, SrTiO$_3$, PZT or PZLT.

4. The method of claim 1 wherein said leakage current preventing dielectric layer is SiO$_2$ or Si$_3$N$_4$.

5. The method of claim 1 wherein the leakage current preventing layer depositing step includes the steps of: depositing an SiO$_2$ layer on said amorphous thin film layer and depositing an Si$_3$N$_4$ layer on said SiO$_2$ layer.

6. The method of claim 1 wherein said leakage current preventing dielectric layer is also an antireflective coating for coupling laser energy to said amorphous thin film layer.

7. A method of forming a capacitor on a substrate, comprising the steps of:
 depositing a bottom electrode on the substrate;
 depositing an amorphous thin film layer of a ferroelectric forming titanate or zirconate on said bottom electrode;
 laser annealing said amorphous thin film layer to a crystalline ferroelectric;
 depositing a leakage current preventing dielectric layer on said amorphous thin film layer; and
 depositing a top electrode on said dielectric layer.

8. The method of claim 7 wherein said bottom electrode comprises a first layer of Zr, Hf or Ta and a second layer of Pt.

9. The method of claim 7 wherein said ferroelectric forming titanate or zirconate is PbTiO$_3$, BaTiO$_3$, CaTiO$_3$, SrTiO$_3$, PZT or PZLT.

10. The method of claim 7 wherein said leakage current preventing dielectric layer is SiO$_2$ or Si$_3$N$_4$.

11. The method of claim 7 wherein the leakage current preventing layer depositing step includes the steps of: depositing an SiO$_2$ layer on said amorphous thin film layer and depositing an Si$_3$N$_4$ layer on said SiO$_2$ layer.

12. A method of forming a capacitor on a substrate, comprising the steps of:
 depositing a bottom electrode on the substrate;
 depositing a leakage current preventing dielectric layer on said bottom electrode;
 depositing an amorphous thin film layer of a ferroelectric forming titanate or zirconate on said bottom electrode;
 laser annealing said amorphous thin film layer to a crystalline ferroelectric; and
 depositing a top electrode on said dielectric layer.

13. The method of claim 12 wherein said bottom electrode comprises a first layer of Zr, Hf or Ta and a second layer of Pt.

14. The method of claim 12 wherein said ferroelectric forming titanate or zirconate is PbTiO$_3$, BaTiO$_3$, CaTiO$_3$, SrTiO$_3$, PZT or PZLT.

15. The method of claim 12 wherein said leakage current preventing dielectric layer is SiO$_2$ or Si$_3$N$_4$.

16. The method of claim 12 wherein said amorphous thin film depositing step is followed by the step of depositing an antireflective coating on said amorphous thin film layer for coupling laser energy to said amorphous thin film layer.

17. The method of claim 16 wherein said laser annealing step is followed by the step of removing said antireflective coating from said amorphous thin film layer.

18. A capacitor structure comprised of a dual dielectric between two electrodes wherein said dual dielectric comprises:
 a first leakage current preventing dielectric layer adjacent a first one of said electrodes; and
 a second dielectric layer between said first dielectric layer and a second one of said electrodes, said second dielectric layer being an amorphous thin film layer of a ferroelectric forming titanate or zirconate which is laser annealed to a crystalline ferroelectric.

19. The structure of claim 18 wherein said bottom electrode comprises a first layer of Zr, Hf or Ta and a second layer of Pt.

20. The structure of claim 18 wherein said ferroelectric forming titanate or zirconate is PbTiO$_3$, BaTiO$_3$, CaTiO$_3$, SrTiO$_3$, PZT or PZLT.

21. The structure of claim 18 wherein said leakage current preventing dielectric layer is SiO$_2$ or Si$_3$N$_4$.

22. The structure of claim 18 wherein said leakage current preventing dielectric layer is a dual layer structure comprising an SiO$_2$ layer and an Si$_3$N$_4$ layer.

* * * * *